US011233084B2

(12) United States Patent
Shin et al.

(10) Patent No.: US 11,233,084 B2
(45) Date of Patent: Jan. 25, 2022

(54) IMAGE SENSOR HAVING SHIELDING INTERCONNECTS

(71) Applicant: SK hynix Inc., Icheon-si (KR)

(72) Inventors: Jong-Hwan Shin, Icheon-si (KR); Hye-Won Mun, Gwangmyeong-si (KR); Hoon-Sang Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 139 days.

(21) Appl. No.: 16/662,420

(22) Filed: Oct. 24, 2019

(65) Prior Publication Data

US 2020/0321382 A1      Oct. 8, 2020

(30) Foreign Application Priority Data

Apr. 5, 2019     (KR) .................. 10-2019-0039956

(51) Int. Cl.
*H01L 27/146*     (2006.01)

(52) U.S. Cl.
CPC .. *H01L 27/14636* (2013.01); *H01L 27/14603* (2013.01); *H01L 27/14612* (2013.01)

(58) Field of Classification Search
CPC ....... H01L 27/14636; H01L 27/14601–14612; H01L 27/146–14893
See application file for complete search history.

(56) References Cited

U.S. PATENT DOCUMENTS

| | | | |
|---|---|---|---|
| 2011/0128400 A1* | 6/2011 | Wakano | H01L 27/14656 348/222.1 |
| 2013/0049082 A1* | 2/2013 | Kato | H01L 27/14603 257/292 |
| 2018/0240826 A1* | 8/2018 | Park | H01L 27/14636 |

* cited by examiner

*Primary Examiner* — Eric A. Ward
(74) *Attorney, Agent, or Firm* — Perkins Coie LLP

(57) ABSTRACT

An image sensor includes one or more first unit pixels. Each of the one or more first unit pixels may include a first photoelectric conversion region including first photoelectric conversion elements arranged in the form of a matrix, and a first floating diffusion region at a center of the first photoelectric conversion elements; a first transistor region including a first active region in which a first reset gate, a first select gate and a first drive gate are disposed; a first signal interconnect electrically connecting the first floating diffusion region to the first drive gate; and a first shielding interconnect separated from the first signal interconnect and extending parallel to the first signal interconnect.

19 Claims, 21 Drawing Sheets

IMAGE SENSOR HAVING SHIELDING INTERCONNECTS

CROSS-REFERENCE TO RELATED APPLICATION

This patent document claims the priority and benefits of Korean Patent Application No. 10-2019-0039956 filed on Apr. 5, 2019, which is incorporated herein by reference in its entirety.

TECHNICAL FIELD

The present document relates to image sensors having interconnects for signal routing and communication and interconnects for shielding.

BACKGROUND

Recently, with the development of information communication technologies and the digitalization of image information, an increasing number of electrical devices, such as a digital camera, a camcorder, a mobile phone, a PCS (personal communication system), a game machine, a security camera and a medical micro camera, are now equipped with image sensors. A highly integrated image sensor includes a large number of very small-sized pixels (photoelectric conversion element), each of which produces insufficient number of photocharges, causing the resolution of the image sensor to decrease.

SUMMARY

This patent document provides, among others, designs of an image sensor that includes interconnects for signal routing and communication ("signal interconnect") and interconnects for shielding (shielding interconnect).

Some embodiments of the disclosed technology provide a method capable of boosting a voltage by coupling the signal interconnects.

Further, some embodiments of the disclosed technology provide a method for improving the conversion gain of electrons in a floating diffusion.

In an embodiment, an image sensor including one or more first unit pixels, each of the one or more first unit pixels may include a first photoelectric conversion region including first photoelectric conversion elements arranged in the form of a matrix, and a first floating diffusion region at a center of the first photoelectric conversion elements; a first transistor region including a first active region in which a first reset gate, a first select gate and a first drive gate are disposed; a first signal interconnect electrically connecting the first floating diffusion region to the first drive gate; and a first shielding interconnect separated from the first signal interconnect and extending parallel to the first signal interconnect.

The first signal interconnect may include a first lower signal interconnect extending between the first photoelectric conversion elements in a column direction of matrix formed by the first photoelectric conversion elements, and electrically connected to the first floating diffusion region; and a first upper signal interconnect extending between the first photoelectric conversion region and the first transistor region in a row direction of matrix formed by the first photoelectric conversion elements, and electrically connected to a portion of the first active region and the first drive gate.

The first shielding interconnect may include a first lower shielding interconnect parallel to the first lower signal interconnect; and a first upper shielding interconnect parallel to the first upper signal interconnect.

Each of the first lower signal interconnect and the first lower shielding interconnect may have a linear shape, and each of the first upper signal interconnect and the first upper shielding interconnect may have a bent shape that extends in the row direction and the column direction.

The first lower signal interconnect may be connected to the first floating diffusion region through a first floating diffusion region contact. The first lower signal interconnect may include an upper portion which extends between the first upper signal interconnect and the first floating diffusion region contact and a lower portion which extends between the first floating diffusion region contact and a lower end of the first lower signal interconnect. The lower end of the first lower signal interconnect may be floated.

The first shielding interconnect may include an upper portion arranged parallel to the upper portion of the first lower signal interconnect and a lower portion arranged parallel to the lower portion of the first lower signal interconnect.

Each of the one or more first unit pixels may further include a first additional shielding interconnect disposed along a side of the signal interconnect opposite to the first shielding interconnect, wherein the first additional shielding interconnect and the first shielding interconnect are symmetrical about the signal interconnect.

The first signal interconnect may include a first lower signal interconnect extending between the first photoelectric conversion elements in a column direction of matrix formed by the first photoelectric conversion elements, and electrically connected to the first floating diffusion region; and a first upper signal interconnect extending between the first photoelectric conversion region and the first transistor region in a row direction of matrix formed by the second photoelectric conversion elements, and electrically connected to a portion of the first active region and the first drive gate. The first shielding interconnect may include a first lower shielding interconnect parallel to the first lower signal interconnect; and a first upper shielding interconnect parallel to the first upper signal interconnect. The additional first shielding interconnect may include a first additional shielding interconnect symmetrical to the first lower shielding interconnect; and a first additional upper shielding interconnect symmetrical to the first upper shielding interconnect.

Each of the one or more first unit pixels may further include a first additional shielding interconnect connecting the first shielding interconnect to the first additional shielding interconnect.

The image sensor including one or more second unit pixels, each of the one or more second unit pixels may include a second photoelectric conversion region including second photoelectric conversion elements arranged in the form of a matrix, and a second floating diffusion region at a center of the second photoelectric conversion elements; a second transistor region including a second active region in which a second reset gate, a second select gate and a second drive gate are disposed; a second signal interconnect electrically connecting the second floating diffusion to the second drive gate; and a second shielding interconnect disposed to be parallel to the second signal interconnect and overlap with at least one of the second photoelectric conversion elements, wherein the first unit pixel and the second unit pixel are symmetrical to each other.

The image sensor may further include an additional signal interconnect electrically connecting the first signal interconnect to the second signal interconnect.

The image sensor may further include an additional shielding interconnect parallel to the additional signal interconnect.

The additional signal interconnect and the additional shielding interconnect may extend in in a row direction of matrix formed by the second photoelectric conversion elements.

The first shielding interconnect may be positioned on a first side of the first signal interconnect. The second shielding interconnect may be positioned on a second side of the second signal interconnect, and the first side and the second side may be opposite to each other.

The first shielding interconnect may be disposed to overlap with at least two of the first photoelectric conversion elements.

In an embodiment, an image sensor may include a pixel block having a first unit pixel and a second unit pixel, the first unit pixel may include a first photoelectric conversion region in which a first floating diffusion region is disposed; a first transistor region in which a first drive gate is disposed; a first signal interconnect electrically connecting the first floating diffusion region to the first drive gate; and a first shielding interconnect disposed in a first side direction of the first signal interconnect, the first shielding interconnect being parallel to the first signal interconnect. The second unit pixel may include a second photoelectric conversion region in which a second floating diffusion region is disposed; a second transistor region in which a second drive gate is disposed; a second signal interconnect electrically connecting the second floating diffusion region to the second drive gate; and a second shielding interconnect disposed in a second side direction of the second signal interconnect, the second shielding interconnect being parallel to the second signal interconnect. The first side direction and the second side direction are opposite to each other.

A layout of the first unit pixel and a layout of the second unit pixel may be symmetrical to each other.

The first photoelectric conversion region may include four first photoelectric conversion elements disposed in the form of a matrix. The second photoelectric conversion region may include four second photoelectric conversion elements disposed in the form of a matrix. The first shielding interconnect may overlap with at least two of the four first photoelectric conversion elements, and the second shielding interconnect may overlap with at least two of the four second photoelectric conversion elements.

The first signal interconnect may include a first upper signal interconnect electrically connecting the first drive gate to a portion of a first active region in the first transistor region; and a first lower signal interconnect electrically connecting a middle portion of the first upper signal interconnect to the first floating diffusion region. The second signal interconnect may include a second upper signal interconnect electrically connecting the second drive gate to a portion of a second active region in the second transistor region; and a second lower signal interconnect electrically connecting a middle portion of the second upper signal interconnect to the second floating diffusion region.

The first lower signal interconnect may further include a first extended portion which extends from the first floating diffusion region to a lower end of the first lower signal interconnect. The second lower signal interconnect may further include a second extended portion which extends from the second floating diffusion region to a lower end of the second lower signal interconnect. The first shielding interconnect may extend to be parallel to the first extended portion. The second shielding interconnect may extend to be parallel to the second extended portion, and the first extended portion and the second extended portion may be in a high-impedance state.

In another embodiment, an image sensor may include: a first unit pixel including: a first photoelectric conversion region including first photoelectric conversion elements which are arranged in the form of a matrix, and a first floating diffusion which is disposed at a center of the first photoelectric conversion elements; a first transistor region including a first active region in which a first reset gate, a first select gate and a first drive gate are disposed; a first signal interconnect electrically connecting the first floating diffusion and the first drive gate; and a first shielding interconnect separated from and extending parallel to the first signal interconnect.

The details of other embodiments are included in the detailed description and the drawings.

According to the embodiments of the disclosed technology, even though an amount of electrons transferred from a floating diffusion to a drive gate is small, a conversion gain in which electrons are converted into a voltage may be improved due to a boosting effect by shielding interconnects.

By applying a voltage or a signal to the shielding interconnects as the occasion demands, the operations of pixels of an image sensor may be optimized and be made efficient, whereby a resolution and a sharpness may be increased.

BRIEF DESCRIPTION OF THE DRAWINGS

As shown in FIGS. 2A to 2C where a first shielding interconnect and a second shielding interconnect are symmetrical to each other, the shielding interconnections illustrated in FIGS. 3A to 3F may be applied to both the first shielding interconnect and the second shielding interconnect.

DETAILED DESCRIPTION

Figure 1:
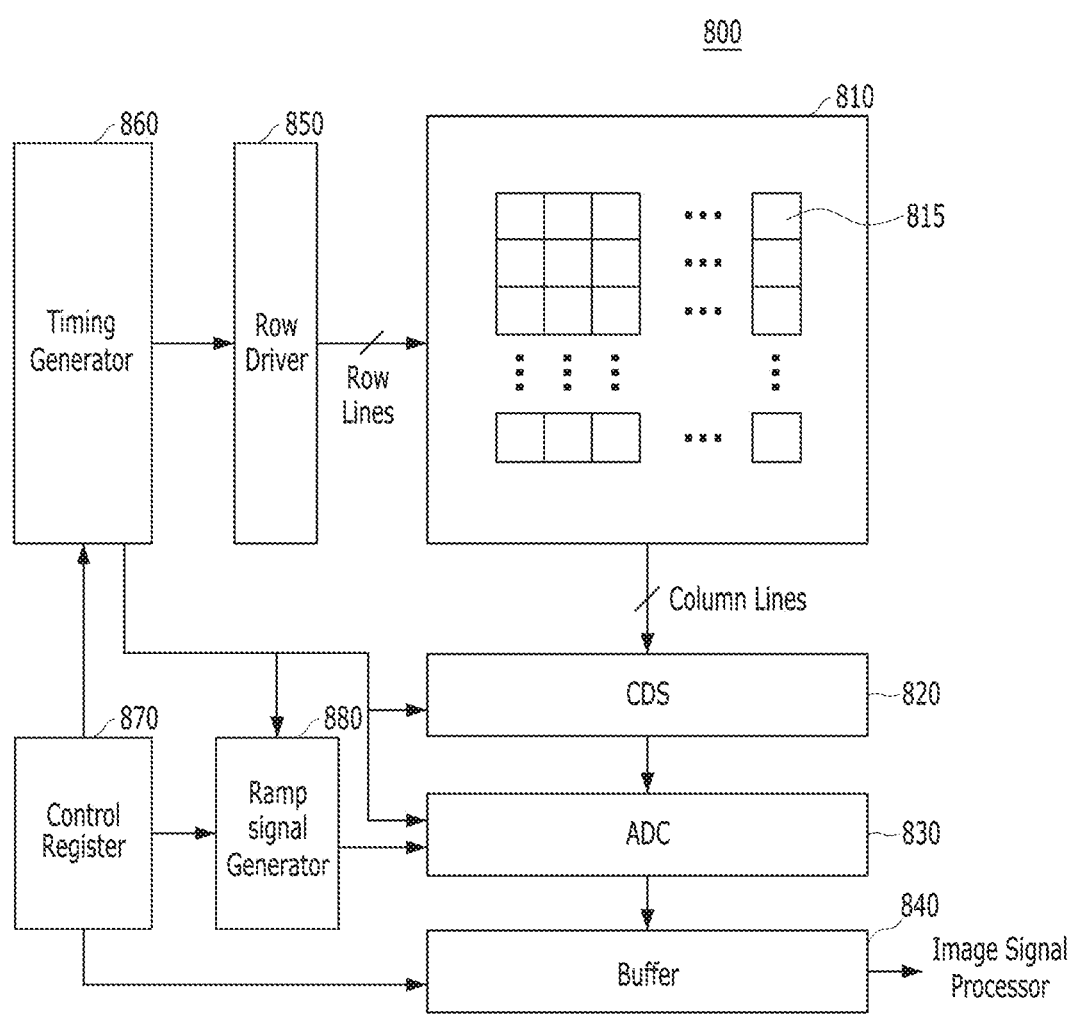
FIG. 1 is a block diagram schematically illustrating an example of an image sensor based on an embodiment of the disclosed technology.

Advantages and features of the disclosure and methods for achieving them will become more apparent after a reading of the following exemplary embodiments taken in conjunction with the drawings. The disclosure may, however, be embodied in different forms and should not be construed as limited to the embodiments set forth herein. Rather, these embodiments are provided to facilitate the understanding of the disclosed technology to those skilled in the art.

Terms used in this specification are used for describing various embodiments, and do not limit the disclosure. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

The terms such as 'below', 'beneath', 'lower', 'above' and 'upper', which are spatially relative terms, may be used to describe the correlation between one element or components and another element or other components, as illustrated in the drawings. The spatially relative terms should be understood as terms including different directions of elements during the use or operation, in addition to the directions illustrated in the drawings. For example, when an element illustrated in a drawing is turned over, the element which is referred to as being 'below' or 'beneath' another element may be positioned above another element.

Moreover, various embodiments of this specification will be described with reference to cross-sectional views and/or plan views which are ideal exemplary diagrams of the disclosure. In the drawings, the dimensions of layers and regions may be exaggerated for clarity of illustration. As such, variations from the shapes of the illustrations as a result, for example, of manufacturing techniques and/or tolerances, are to be expected. Thus, embodiments of the present disclosure should not be construed as limited to the particular shapes illustrated herein but are to include deviations in shapes that result, for example, from manufacturing processes. For example, an angled region may have a round shape or a certain curvature. Thus, the regions illustrated in the figures are schematic in nature and their shapes are not intended to illustrate the actual shape of a region of a device and are not intended to limit the scope of the invention.

Throughout the specification, like reference numerals refer to like elements. Therefore, although the same or similar reference numerals are not mentioned or described in a corresponding drawing, the reference numerals may be described with reference to other drawings. Furthermore, although elements are not represented by reference numerals, the elements may be described with reference to other drawings.

An imaging sensor array of imaging pixels can be used to convert incident light received by different imaging pixels into electrical charges or signals to represent images. The imaging pixels can be semiconductor photosensors formed on a substrate. Each imaging pixel may be implemented by a photo-sensing element such as a photodiode, a photo transistor, a photo gate, or other photosensitive circuitry capable of converting light into a pixel signal (e.g., a charge, a voltage or a current). An imaging device such as a digital camera, includes a camera lens system (often implemented using a set of lenses) that captures the incident light from a target object or scene onto the imaging sensor array. The optical structure formed over the imaging pixels in the imaging sensor array receives the incident light from the camera lens system and provides the received incident light to individual imaging pixels. In many imaging devices, the optical structure formed over the imaging pixels can include an array of microlenses that spatially correspond to the imaging pixels in the imaging sensor array; the microlens configuration improves the optical collection efficiency and may also include optical color filters that are placed to spatially correspond to the imaging pixels for capturing the color information of images. Example configurations in this patent document show a pixel arrangement of colored imaging pixels labeled as "R" for a red colored pixel, "G" for a green colored pixel, and "B" for a blue colored pixel.

FIG. 1 is a block diagram schematically illustrating an example of an image sensor 800 based on an embodiment of the disclosed technology. Referring to FIG. 1, the image sensor 800 may include a pixel array 810, a correlated double sampler (CDS) 820, an analog-digital converter (ADC) 830, a buffer 840, a row driver 850, a timing generator 860, a control register 870, and a ramp signal generator 880.

The pixel array 810 may include a plurality of pixel blocks 815 which are arranged in a matrix structure. Each of the plurality of pixel blocks 815 may convert an optical image information (e.g., incident light photons) into an electrical image signal, and transfer the electrical image signal to the CDS 820 through a column line. Each of the plurality of pixel blocks 815 may be coupled to one of row lines and one of column lines.

A CMOS image sensor may use the correlated double sampling (CDS) to remove an offset value of pixels by sampling a pixel signal twice so that the difference is taken between these two samples. In an embodiment of the disclosed technology, the correlated double sampling (CDS) may remove an offset value of pixels by comparing pixel signals (pixel output voltages) obtained before and after light is incident on the pixels so that only pixel signals based on the incident light can be actually measured. The CDS 820 may temporarily store and sample electrical image signals which are received from the pixel blocks 815 of the pixel array 810. For example, the CDS 820 may sample a reference voltage level and a voltage level of a received electrical image signal according to a clock signal provided from the timing generator 860, and may transfer an analog signal corresponding to the difference therebetween to the ADC 830.

The ADC 830 may convert the received analog signal into a digital signal, and transfer the digital signal to the buffer 840.

The buffer 840 may hold or latch the received digital signal and successively output the latched digital signal to an external image signal processor. The buffer 840 may include a memory for holding or latching the digital signal and a sense amplifier for amplifying the digital signal.

The row driver 850 may drive the plurality of pixel blocks 815 of the pixel array 810 according to a signal from the timing generator 860. For example, the row driver 850 may generate select signals for selecting one of the plurality of row lines and/or driving signals for driving one of the plurality of row lines.

The timing generator 860 may generate a timing signal for controlling the CDS 820, the ADC 830, the row driver 850 and the ramp signal generator 880.

The control register 870 may generate control signals for controlling the buffer 840, the timing generator 860 and the ramp signal generator 880.

The ramp signal generator 880 may generate a ramp signal to be used to convert analog signals (e.g., electrical image signals outputted from the buffer 840) into digital signals, under the control of the timing generator 860.

Figure 2A:
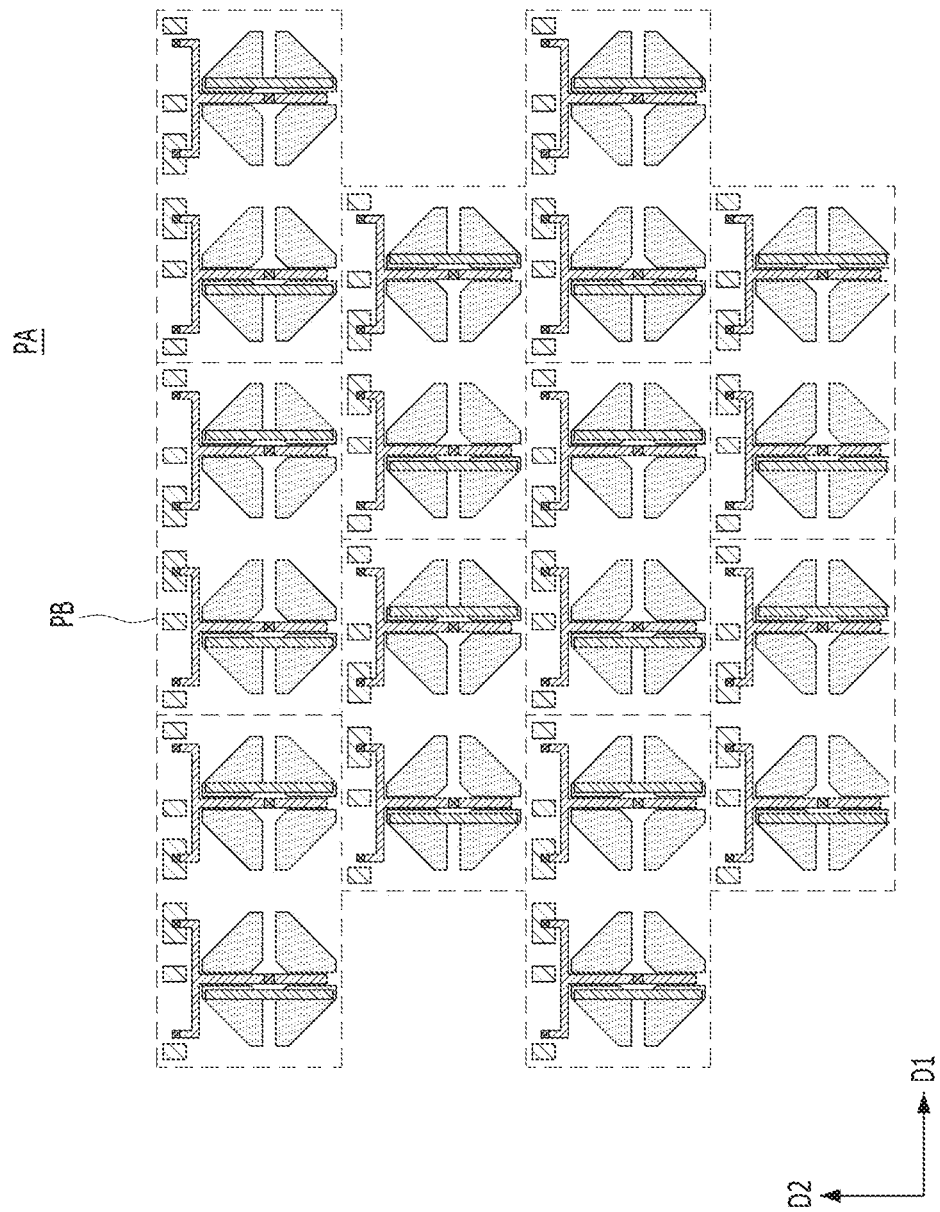
FIG. 2A is a layout diagram schematically illustrating an example of a pixel array of an image sensor based on an embodiment of the disclosed technology.
Figure 2B:
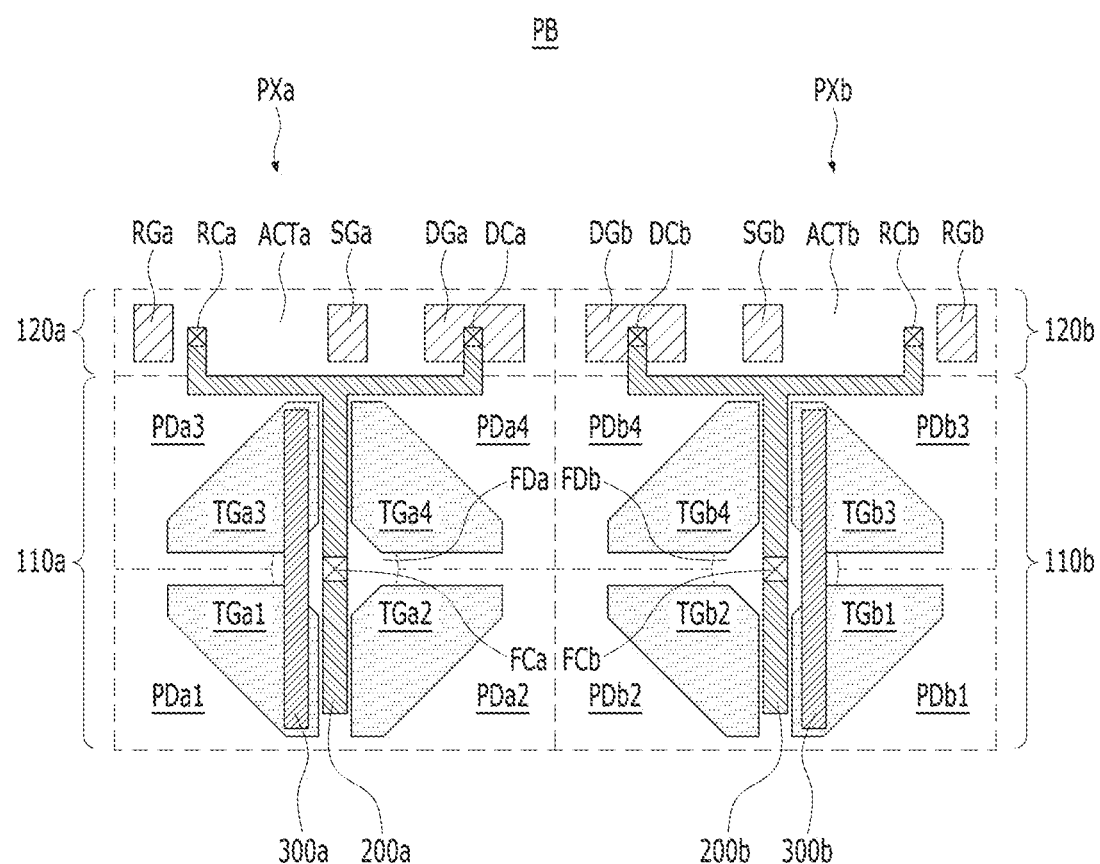
FIG. 2B is a layout diagram schematically illustrating one pixel block in the pixel array.
Figure 2C:
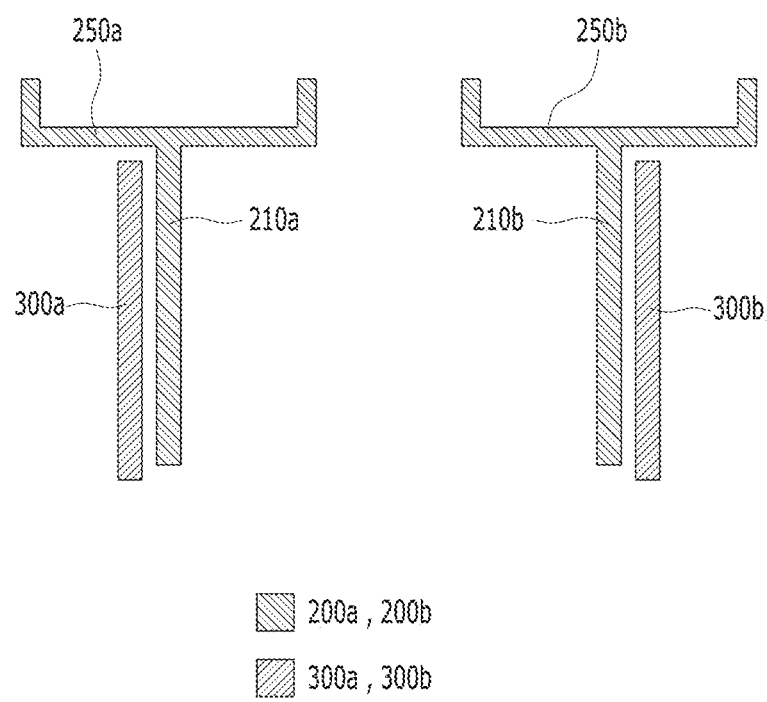
FIG. 2C is a layout diagram conceptually illustrating signal interconnects and shielding interconnects of unit pixels in the pixel block.

FIG. 2A is a layout diagram schematically illustrating an example of a pixel array PA of an image sensor based on an embodiment of the disclosed technology, FIG. 2B is a layout diagram schematically illustrating one pixel block PB in the pixel array PA, and FIG. 2C is a layout diagram conceptually illustrating signal interconnects 200*a* and 200*b* and shielding interconnects 300*a* and 300*b* of unit pixels PXa and PXb in the pixel block PB.

Referring to FIGS. 2A to 2C, the pixel array PA of an image sensor may include a plurality of pixel blocks PB which are arranged in the form of a matrix. The plurality of pixel blocks PB may be aligned side by side in a row direction D1, and may be arranged in a zigzag style in a column direction D2. Each pixel block PB may include a first unit pixel PXa and a second unit pixel PXb. The first and second unit pixels PXa and PXb may be symmetrical to each other. For example, the first and second unit pixels PXa and PXb are arranged in the row direction D1 and symmetrical about an axis in the column direction D2.

The first unit pixel PXa may include a first photoelectric conversion region 110*a*, a first transistor region 120*a*, a first signal interconnect 200*a* and a first shielding interconnect 300*a*, and the second unit pixel PXb may include a second photoelectric conversion region 110*b*, a second transistor region 120*b*, a second signal interconnect 200*b* and a second shielding interconnect 300*b*.

The first photoelectric conversion region 110*a* may include four first photoelectric conversion elements PDa1 to PDa4 which are arranged in the form of a matrix with two rows and two columns, a first floating diffusion (floating diffusion region) FDa which is disposed at the center of the four first photoelectric conversion elements PDa1 to PDa4, and four first transfer gates TGa1 to TGa4 which are disposed to partially overlap with the four first photoelectric conversion elements PDa1 to PDa4 and the first floating diffusion FDa, respectively. The second photoelectric conversion region 110*b* may include four second photoelectric conversion elements PDb1 to PDb4 which are arranged in the form of a matrix with two rows and two columns, a second floating diffusion (floating diffusion region) FDb which is disposed at the center of the four second photoelectric conversion elements PDb1 to PDb4, and four second transfer gates TGb1 to TGb4 which are disposed to partially overlap with the four second photoelectric conversion elements PDb1 to PDb4 and the second floating diffusion FDb, respectively.

The first transistor region 120*a* may include a first reset gate RGa, a first select gate SGa, and a first drive gate DGa, which are disposed in the row direction D1 on a first active region ACTa. The second transistor region 120*b* may include a second drive gate DGb, a second select gate SGb, and a second reset gate RGb, which are disposed in the row direction D1 on a second active region ACTb. The components in the first transistor region 120*a* and the components in the second transistor region 120*b* may be symmetrical to each corresponding component.

Each of the first and second signal interconnects (interconnects for signal routing and communication) 200*a* and 200*b* may have a Y shape or a T shape. The first and second signal interconnects 200*a* and 200*b* may be symmetrically arranged. The first signal interconnect 200*a* may electrically connect the first floating diffusion FDa, a portion of the first active region ACTa, and the first drive gate DGa to each other. In detail, the first signal interconnect 200*a* and the first floating diffusion FDa may be electrically connected to each other through a first floating diffusion (FD) contact FCa. The first signal interconnect 200*a* and the portion of the first active region ACTa may be electrically connected to each other through a first reset contact RCa. The first signal interconnect 200*a* and the first drive gate DGa may be electrically connected to each other through a first drive contact DCa. The second signal interconnect 200*b* may electrically connect the second floating diffusion FDb, a portion of the second active region ACTb and the second drive gate DGb to each other. In detail, the second signal interconnect 200*b* and the second floating diffusion FDb may be electrically connected to each other through a second FD contact FCb. The second signal interconnect 200*b* and the portion of the second active region ACTb may be electrically connected to each other through a second reset contact RCb. The second signal interconnect 200*b* and the second drive gate DGb may be electrically connected to each other through a second drive contact DCb.

The first signal interconnect 200*a* may electrically connect the first floating diffusion FDa, the portion of the first active region ACTa and the first drive gate DGa. In detail, the first signal interconnect 200*a* may electrically connect the first FD contact FCa, the first reset contact RCa and the first drive contact DCa to each other. The first signal interconnect 200*a* may include a first lower signal interconnect 210*a* and a first upper signal interconnect 250*a*.

The first lower signal interconnect 210*a* may have a linear shape that extends between the first photoelectric conversion elements PDa1 to PDa4 and between the first transfer gates TGa1 to TGa4 in the column direction D2. The first lower signal interconnect 210*a* may electrically connect the first upper signal interconnect 250*a* to the first FD contact FCa. The first FD contact FCa may overlap with the middle portion of the first lower signal interconnect 210*a*. In detail, the first lower signal interconnect 210*a* may extend downward (in the column direction D2) past the first FD contact FCa from the first upper signal interconnect 250*a*. In some implementations, an end (lower end in FIG. 2C) of the first lower signal interconnect 210*a* floats in a high-impedance state. The first lower signal interconnect 210*a* may have an upper portion arranged between the first upper signal interconnect 250*a* and the first FD contact FCa, and a lower portion arranged between the first FD contact FCa and the lower end of the first lower signal interconnect 210*a*.

The first upper signal interconnect 250*a* may be arranged along a boundary between the first photoelectric conversion region 110*a* and the first transistor region 120*a* in the row direction D1, and may have a linear shape or a U shape with edges (e.g., elbow shape) connected to the first reset contact RCa and the first drive contact DCa. In another embodiment, the first upper signal interconnect 250*a* may have a V shape or a Y shape.

The second signal interconnect 200*b* may electrically connect the second floating diffusion FDb, the portion of the second active region ACTb and the second drive gate DGb to each other. In detail, the second signal interconnect 200*b* may electrically connect the second FD contact FCb, the second reset contact RCb and the second drive contact DCb to each other. The second signal interconnect 200b may include a second lower signal interconnect 210b and a second upper signal interconnect 250b.

The second lower signal interconnect 210b may have a linear shape that extends between the second photoelectric conversion elements PDb1 to PDb4 and between the second transfer gates TGb1 to TGb4 in the column direction D2. The second lower signal interconnect 210b may electrically connect the second upper signal interconnect 250b to the second FD contact FCb. The second FD contact FCb may overlap with the middle portion of the second lower signal interconnect 210b. In detail, the second lower signal interconnect 210b may extend downward (in the column direction D2) past the second FD contact FCb from the second upper signal interconnect 250b. In some implementations, an end (lower end in FIG. 2C) of the second lower signal interconnect 210b floats in a high-impedance state. The second lower signal interconnect 210b may have an upper portion arranged between the second upper signal interconnect 250b and the second FD contact FCb, and a lower portion arranged between the second FD contact FCb and the lower end of the second lower signal interconnect 210b.

The second upper signal interconnect 250b may be arranged along a boundary between the second photoelectric conversion region 110b and the second transistor region 120b in the row direction D1, and may have a linear shape or a U shape with edges connected to the second reset contact RCb and the second drive contact DCb. In another embodiment, the second upper signal interconnect 250b may also have a V shape or a Y shape.

The middle or center portions of the first and second upper signal interconnects (interconnects for signal routing and communication) 250a and 250b may be electrically connected to the upper ends of the first and second lower signal interconnects 210a and 210b, respectively. The first and second lower signal interconnects 210a and 210b and the first and second upper signal interconnects 250a and 250b may be formed in the same fabrication process so that they are formed of the same material and geometrically continuous.

The first shielding interconnect 300a may have a linear shape that extends in the column direction D2 to be parallel to the first lower signal interconnect 210a. The first shielding interconnect 300a may partially overlap with a portion of the first floating diffusion FDa, two of the first photoelectric conversion elements PDa1 to PDa4 and two of the first transfer gates TGa1 to TGa4. The second shielding interconnect 300b may have a linear shape that extends in the column direction D2 to be parallel to the second lower signal interconnect 210b. The second shielding interconnect 300b may partially overlap with a portion of the second floating diffusion FDb, two of the second photoelectric conversion elements PDb1 to PDb4 and two of the second transfer gates TGb1 to TGb4.

Due to the capacitance formed between the first shielding interconnect 300a and the first lower signal interconnect 210a, the first lower signal interconnect 210a may be coupled to other components by providing a voltage to the first shielding interconnect 300a. For example, when a voltage is applied to the first shielding interconnect 300a, a voltage level at the first lower signal interconnect 210a may be changed.

A conversion gain can indicate the ability to convert the electrons generated by the imaging pixels into a voltage. In some embodiments of the disclosed technology, the conversion gain may be improved by the voltage provided to the first shielding interconnect 300a. For example, when electrons collected in the first floating diffusion FDa are converted into a voltage, the voltage provided to the first shielding interconnect 300a may increase a voltage converted from one electron. In other words, the first shielding interconnect 300a may be used to improve the electron-voltage conversion gain of the first unit pixel PXa. Therefore, even when the number of electrons collected in the first floating diffusion FDa is small, the voltage provided to the first drive gate DGa may be increased, and the image forming capability of the first unit pixel PXa and the image sensor may be improved.

FIGS. 3A to 3F are layout diagrams illustrating examples of signal interconnects 200 and shielding interconnects 300 based on various embodiments of the disclosed technology. As shown in FIGS. 2A to 2C where the first shielding interconnect 300a and the second shielding interconnect 300b are symmetrical to each other, the shielding interconnects 300 illustrated in FIGS. 3A to 3F may be divided into the first shielding interconnect 300a and the second shielding interconnect 300b symmetrical to each other.

Figure 3A:
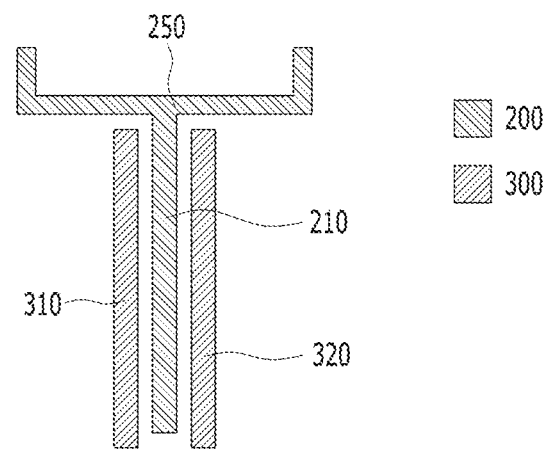
FIGS. 3A to 3F are layout diagrams illustrating examples of signal interconnects and shielding interconnects based on various embodiments of the disclosed technology.

Referring to FIG. 3A, a shielding interconnect 300 based on an embodiment of the disclosed technology may include a main shielding interconnect 310 and an additional shielding interconnect 320. The main shielding interconnect 310 and the additional shielding interconnect 320 may be disposed on both sides of a lower signal interconnect 210 such that the main shielding interconnect 310 and the additional shielding interconnect 320 are symmetrical about the lower signal interconnect 210. The main shielding interconnect 310 and the additional shielding interconnect 320 may be electrically connected to each other through an interconnect such as a contact plug. Because an area over which the lower signal interconnect 210 faces the main shielding interconnect 310 and the additional shielding interconnect 320 increases, the coupling effect of the lower signal interconnect 210 may be increased, and thus, the conversion gain may be further improved.

Figure 3B:
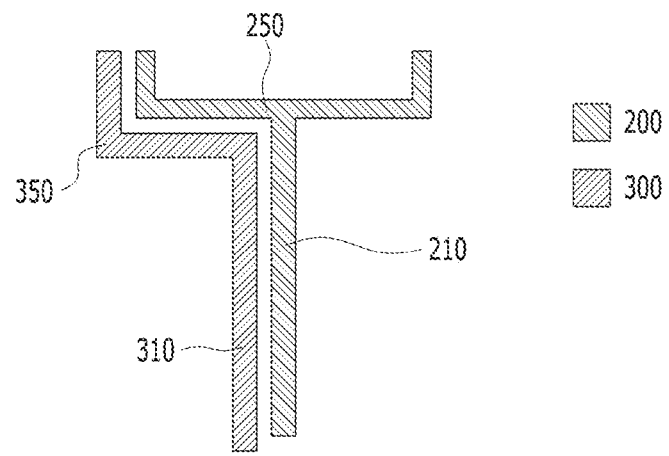

Referring to FIG. 3B, a shielding interconnect 300 based on an embodiment of the disclosed technology may include a lower shielding interconnect 310 which extends parallel to a lower signal interconnect 210 and an upper shielding interconnect 350 which extends parallel to an upper signal interconnect 250. The upper shielding interconnect 350 may be disposed in a linear shape and/or a bent shape to face the outer surface of the upper signal interconnect 250. For example, the upper shielding interconnect 350 may be separated from the upper signal interconnect 250 to surround a portion of the lower surface and a portion of the outer side surface of the upper signal interconnect 250. The upper shielding interconnect 350 and the lower shielding interconnect 310 may be connected to each other.

Figure 3C:
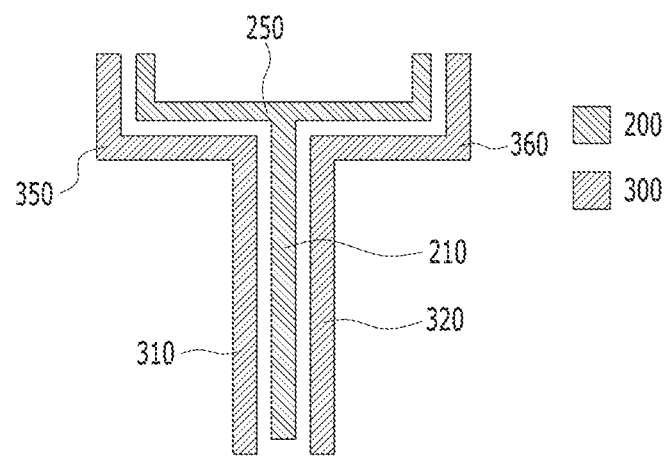

Referring to FIG. 3C, a shielding interconnect 300 based on an embodiment of the disclosed technology may include a main lower shielding interconnect 310 and an additional lower shielding interconnect 320 which are disposed on both sides of a lower signal interconnect 210, and a main upper shielding interconnect 350 and an additional upper shielding interconnect 360 which face the lower outer surface of an upper signal interconnect 250. The main upper shielding interconnect 350 and the additional upper shielding interconnect 360 may be symmetrical to each other.

Figure 3D:
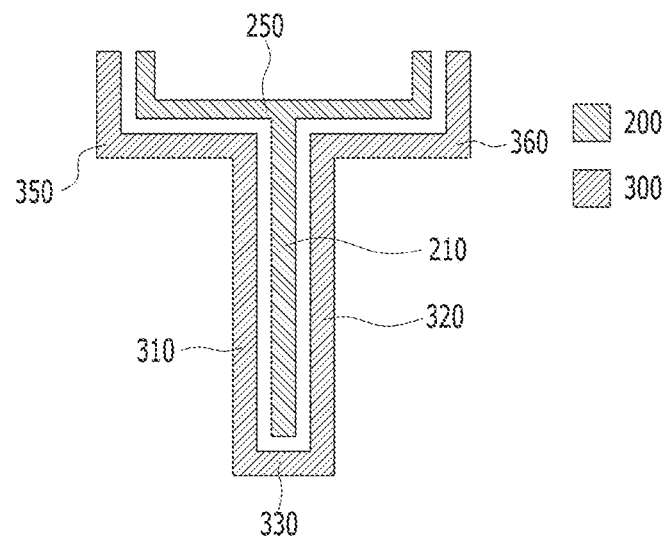

Referring to FIG. 3D, a shielding interconnect 300 based on an embodiment of the disclosed technology may include a main lower shielding interconnect 310 and an additional lower shielding interconnect 320, a main upper shielding interconnect 350 and an additional upper shielding interconnect 360, and a lower interconnecting shielding interconnect 330 which electrically connects the main lower shielding interconnect 310 to the additional lower shielding interconnect 320 at the same plane level. The lower interconnecting shielding interconnect 330 may be connected to the lower ends of the lower shielding interconnects 310 and 320 while being separated from the lower end of a lower signal interconnect 210.

Figure 3E:
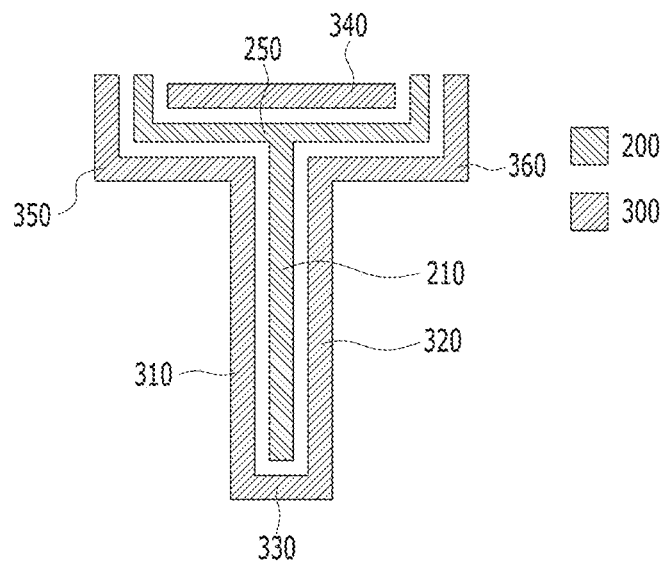

Referring to FIG. 3E, a shielding interconnect 300 based on an embodiment of the disclosed technology may include a main lower shielding interconnect 310 and an additional lower shielding interconnect 320, a main upper outer shielding interconnect 350 and an additional upper outer shielding interconnect 360, a lower interconnecting shielding interconnect 330, and an upper inner shielding interconnect 340 over an upper signal interconnect 250. The upper inner shielding interconnect 340 may be disposed in a virtual inner space, that is, a bowl-shaped recess, of the upper signal interconnect 250. The main lower shielding interconnect 310, the additional lower shielding interconnect 320, the main upper outer shielding interconnect 350, the additional upper outer shielding interconnect 360 and the lower interconnecting shielding interconnect 330 may be electrically connected with the upper inner shielding interconnect 340 through an interconnect such as a contact plug.

Figure 3F:
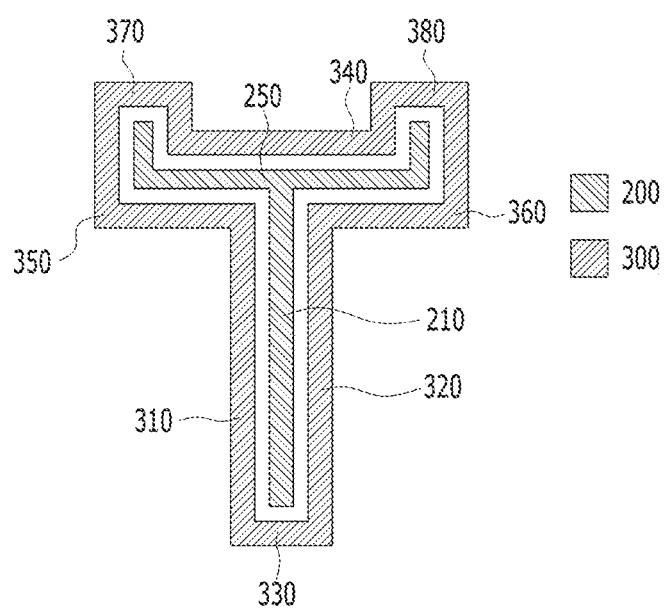

Referring to FIG. 3F, a shielding interconnect 300 based on an embodiment of the disclosed technology may include a main lower shielding interconnect 310 and an additional lower shielding interconnect 320, a main upper outer shielding interconnect 350 and an additional upper outer shielding interconnect 360, a lower interconnecting shielding interconnect 330, an upper inner shielding interconnect 340 over an upper signal interconnect 250, a main upper interconnecting shielding interconnect 370 which connects the main upper outer shielding interconnect 350 to the upper inner shielding interconnect 340, and an additional upper interconnecting shielding interconnect 380 which connects the additional upper outer shielding interconnect 360 to the upper inner shielding interconnect 340. Therefore, the shielding interconnect 300 may be disposed to two-dimensionally surround a signal interconnect 200 at the same plane level.

The shielding interconnects 300 illustrated in FIGS. 3A to 3F may increase an area over which each shielding interconnect 300 faces the signal interconnect 200. Namely, the capacitance between the signal interconnect 200 and each shielding interconnect 300 may be increased based on various embodiments of the disclosed technology, improving the conversion gain of each pixel of an image sensor.

Figure 4A:
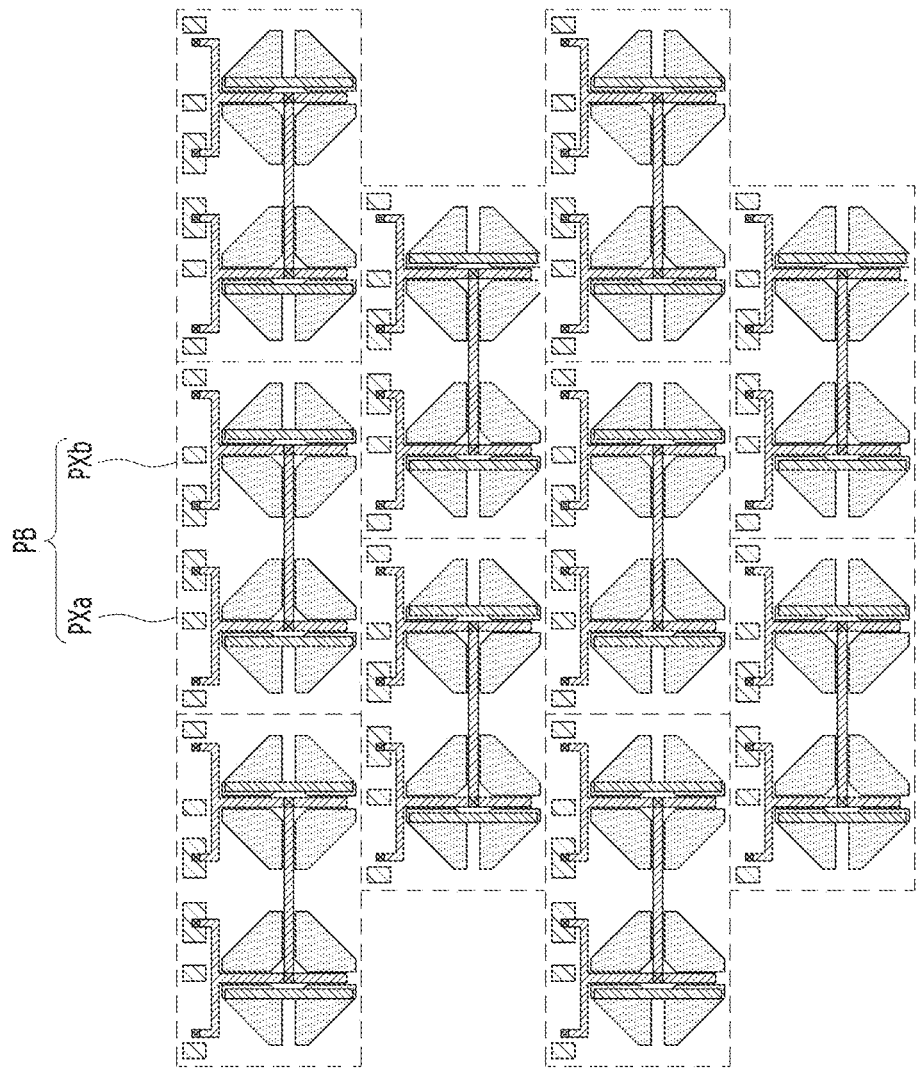
FIG. 4A is a layout diagram schematically illustrating an example of a pixel array of an image sensor based on an embodiment of the disclosed technology.
Figure 4B:
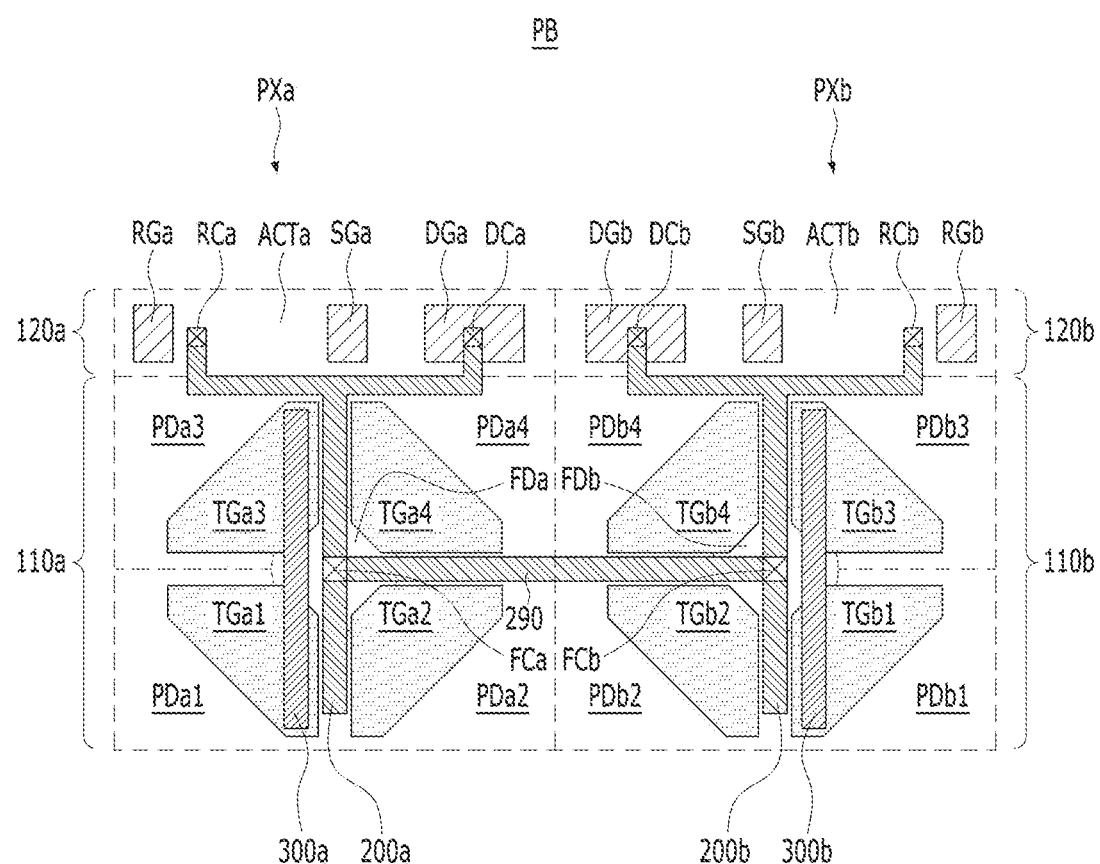
FIG. 4B is a layout diagram schematically illustrating one pixel block in the pixel array.
Figure 4C:
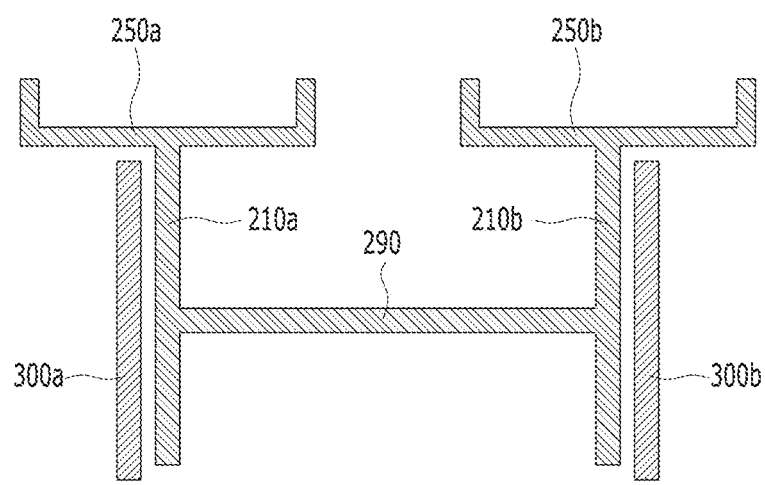
FIG. 4C is a layout diagram conceptually illustrating a signal interconnect and a shielding interconnect of the pixel block.

FIG. 4A is a layout diagram schematically illustrating an example of a pixel array PA of an image sensor based on an embodiment of the disclosed technology, FIG. 4B is a layout diagram schematically illustrating one pixel block PB in the pixel array PA, and FIG. 4C is a layout diagram conceptually illustrating a signal interconnect 200 and a shielding interconnect 300 of the pixel block PB.

Referring to FIGS. 4A to 4C, the pixel array PA may include a plurality of pixel blocks PB arranged in the form of a matrix. The plurality of pixel blocks PB may be aligned side by side in a row direction D1, and may be arranged in a zigzag style in a column direction D2.

Each pixel block PB may have a first unit pixel PXa and a second unit pixel PXb. The first and second unit pixels PXa and PXb may be arranged to be symmetrical to each other in the row direction D1. For example, the first and second unit pixels PXa and PXb may have a layout in which they are mirrored with each other in the row direction D1.

The first unit pixel PXa may include a first photoelectric conversion region 110a, a first transistor region 120a, a first signal interconnect 200a and a first shielding interconnect 300a, and the second unit pixel PXb may include a second photoelectric conversion region 110b, a second transistor region 120b, a second signal interconnect 200b and a second shielding interconnect 300b. The first and second photoelectric conversion regions 110a and 110b, the first and second transistor regions 120a and 120b, the first and second signal interconnects 200a and 200b and the first and second shielding interconnects 300a and 300b may be understood by referring to FIGS. 2A to 2C.

The first signal interconnect 200a may include a first lower signal interconnect 210a and a first upper signal interconnect 250a, and the second signal interconnect 200b may include a second lower signal interconnect 210b and a second upper signal interconnect 250b. The first and second signal interconnects 200a and 200b may have a similar structure to those illustrated in FIGS. 2A to 2C.

The pixel block PB may further include an interconnecting signal interconnect (additional signal interconnect) 290 which connects the first signal interconnect 200a to the second signal interconnect 200b. Accordingly, by the interconnecting signal interconnect 290, components of the first unit pixel PXa may be electrically connected the corresponding components of the second unit pixel PXb, respectively. For example, a first floating diffusion FDa of the first unit pixel PXa and a second floating diffusion FDb of the second unit pixel PXb may be electrically connected to each other. Since a first drive gate DGa is coupled to a second drive gate DGb through the first and second signal interconnections 200a and 200b and the interconnecting signal interconnect 290, the first drive gate DGa and the second drive gate DGb may be simultaneously turned on and off. Since a portion of a first active region ACTa is coupled to a portion of a second active region ACTb through the first and second signal interconnects 200a and 200b and the interconnecting signal interconnect 290, the first and second floating diffusions FDa and FDb may be simultaneously reset.

Each of the first shielding interconnect 300a and the second shielding interconnect 300b may have a linear shape that extends in the column direction D2 to be parallel to each of the first lower signal interconnect 210a and the second lower signal interconnect 210b. For example, each of the first shielding interconnect 300a and the second shielding interconnect 300b may be disposed to be adjacent to the outer surface of each of the first lower signal interconnect 210a and the second lower signal interconnect 210b. In other words, the first shielding interconnect 300a is disposed along a side of the first lower signal interconnect 210a that faces away from the second lower signal interconnect 210b, and the second shielding interconnect 300b is disposed along a side of the second lower signal interconnect 210b that faces away from the first lower signal interconnect 210a.

FIGS. 5A to 5D are layout diagrams illustrating examples of signal interconnects 200a and 200b and shielding interconnects 300a and 300b based on various embodiments of the disclosed technology.

Figure 5A:
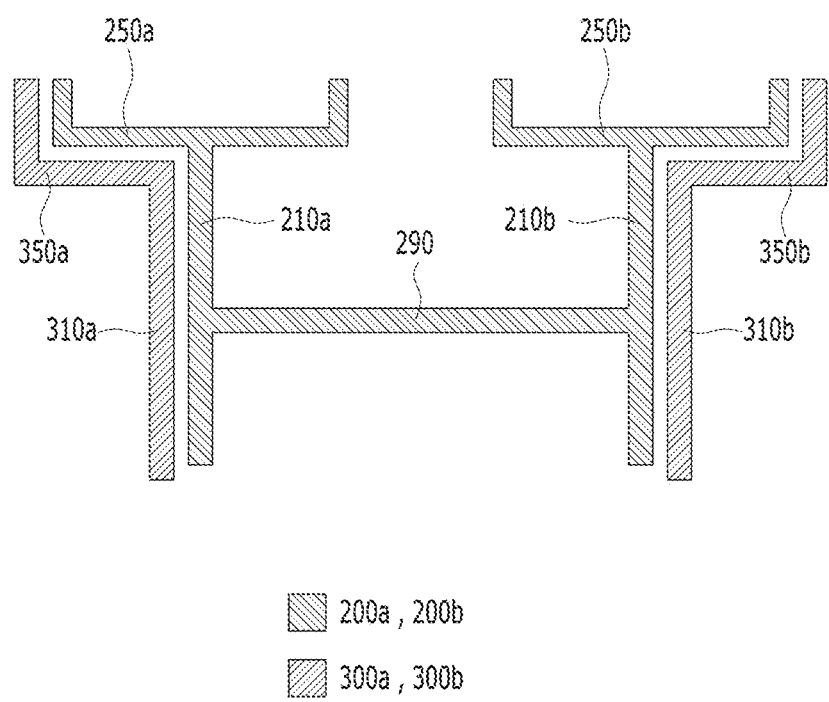
FIGS. 5A to 5D are layout diagrams illustrating examples of signal interconnects and shielding interconnects based on various embodiments of the disclosed technology.

Referring to FIG. 5A, signal interconnects 200a and 200b based on an embodiment of the disclosed technology may include lower signal interconnects 210a and 210b and upper signal interconnects 250a and 250b, and shielding interconnects 300a and 300b may include lower shielding interconnects 310a and 310b which are parallel to one side surfaces of the lower signal interconnections 210a and 210b, respectively, and upper shielding interconnects 350a and 350b which are disposed in a linear shape or a bent shape to face partial outer surfaces of the upper signal interconnects 250a and 250b. The shielding interconnects 300a and 300b may be disposed to surround the outer surfaces of the signal interconnects 200a and 200b. Namely, the lower shielding interconnects 310a and 310b may be disposed to be parallel to the outer side surfaces of the lower signal interconnects 210a and 210b, and the upper shielding interconnects 350a and 350b may be disposed to be parallel to the outer surfaces of the upper signal interconnects 250a and 250b.

Figure 5B:
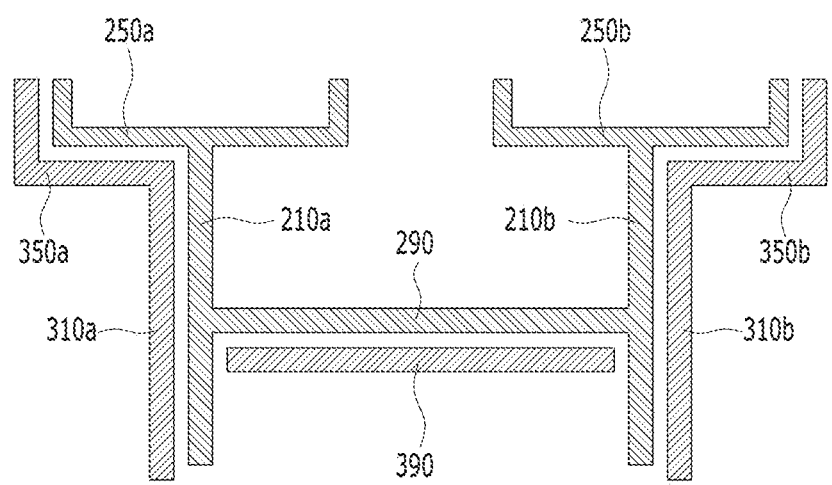

Referring to FIG. 5B, shielding interconnects 300a and 300b based on an embodiment of the disclosed technology may include lower shielding interconnects 310a and 310b, upper shielding interconnects 350a and 350b, and an interconnecting shielding interconnect (additional shielding interconnect) 390. The interconnecting shielding interconnect 390 may have a linear shape that extends in the row direction D1 to be parallel to an interconnecting signal interconnect 290. The interconnecting shielding interconnect 390 may be electrically connected to the lower shielding interconnects 310a and 310b.

Figure 5C:
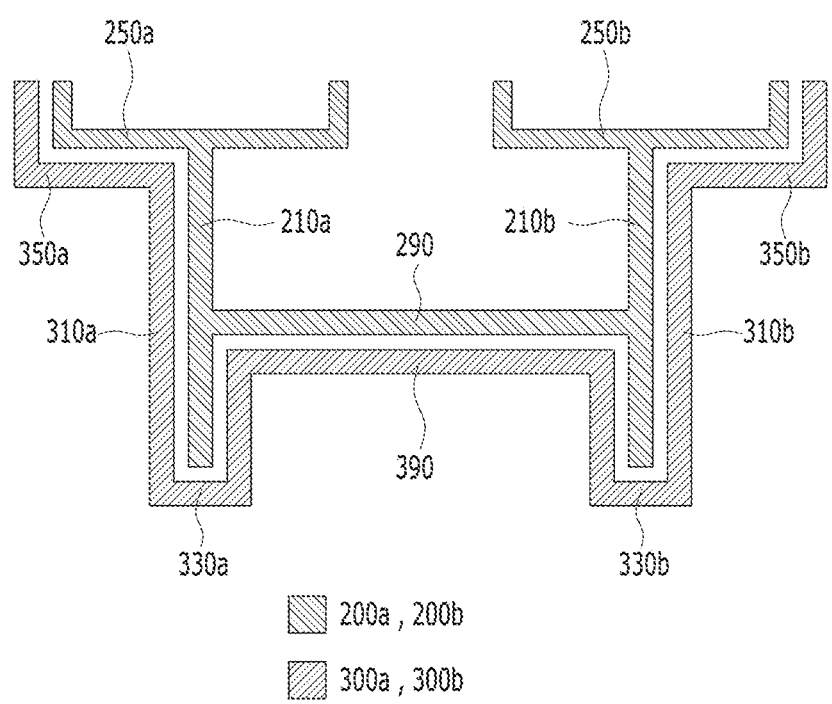

Referring to FIG. 5C, shielding interconnects 300a and 300b based on an embodiment of the disclosed technology may include lower shielding interconnects 310a and 310b, upper shielding interconnects 350a and 350b, an interconnecting shielding interconnect 390, a first lower interconnecting shielding interconnect 330a which connects the first lower shielding interconnect 310a to the interconnecting shielding interconnect 390, and a second lower interconnecting shielding interconnect 330b which connects the second lower shielding interconnect 310b to the interconnecting shielding interconnect 390. The first lower interconnecting shielding interconnect 330a may connect the first lower shielding interconnect 310a to the interconnecting shielding interconnect 390, and the second lower interconnecting shielding interconnect 330b may connect the second lower shielding interconnect 310b to the interconnecting shielding interconnect 390. The first lower interconnecting shielding interconnect 330a may surround the lower end of a first lower signal interconnect 210a in a linear shape and/or a bent shape (e.g., U shape), and the second lower interconnecting shielding interconnect 330b may surround the lower end of a second lower signal interconnect 210b in a linear shape and/or a bent shape (e.g., U shape).

Figure 5D:
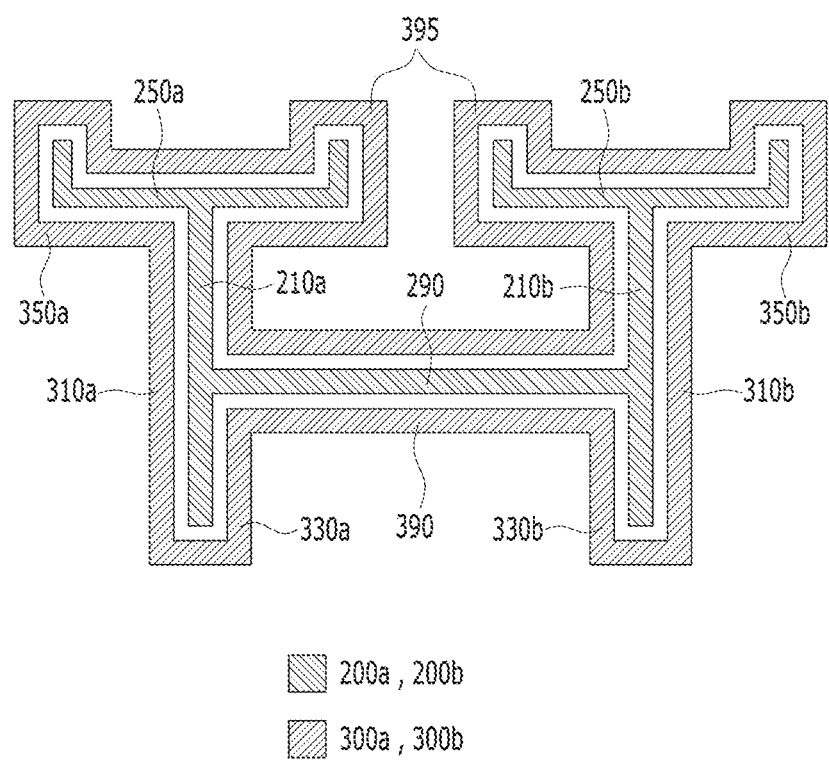

Referring to FIG. 5D, shielding interconnects 300a and 300b based on an embodiment of the disclosed technology may include a first shielding interconnect 310a, a second shielding interconnect 310b, an interconnecting shielding interconnect 390 and an additional interconnecting shielding interconnect 395 which two-dimensionally surround a first signal interconnect 200a, a second signal interconnect 200b and an interconnecting signal interconnect 290. The additional interconnecting shielding interconnect 395 may surround the upper surfaces and inner side surfaces of first and second upper signal interconnects 250a and 250b and the interconnecting signal interconnect 290. For example, the additional interconnecting shielding interconnect 395 may surround the upper ends of the first and second upper signal interconnects 250a and 250b in a linear shape and/or a bent shape (e.g., a U shape).

The shielding interconnects 300a and 300b illustrated in FIGS. 5A to 5D may increase an area over which each of the shielding interconnects 300a and 300b faces each of the first and second signal interconnects 200a and 200b.

Figure 6A:
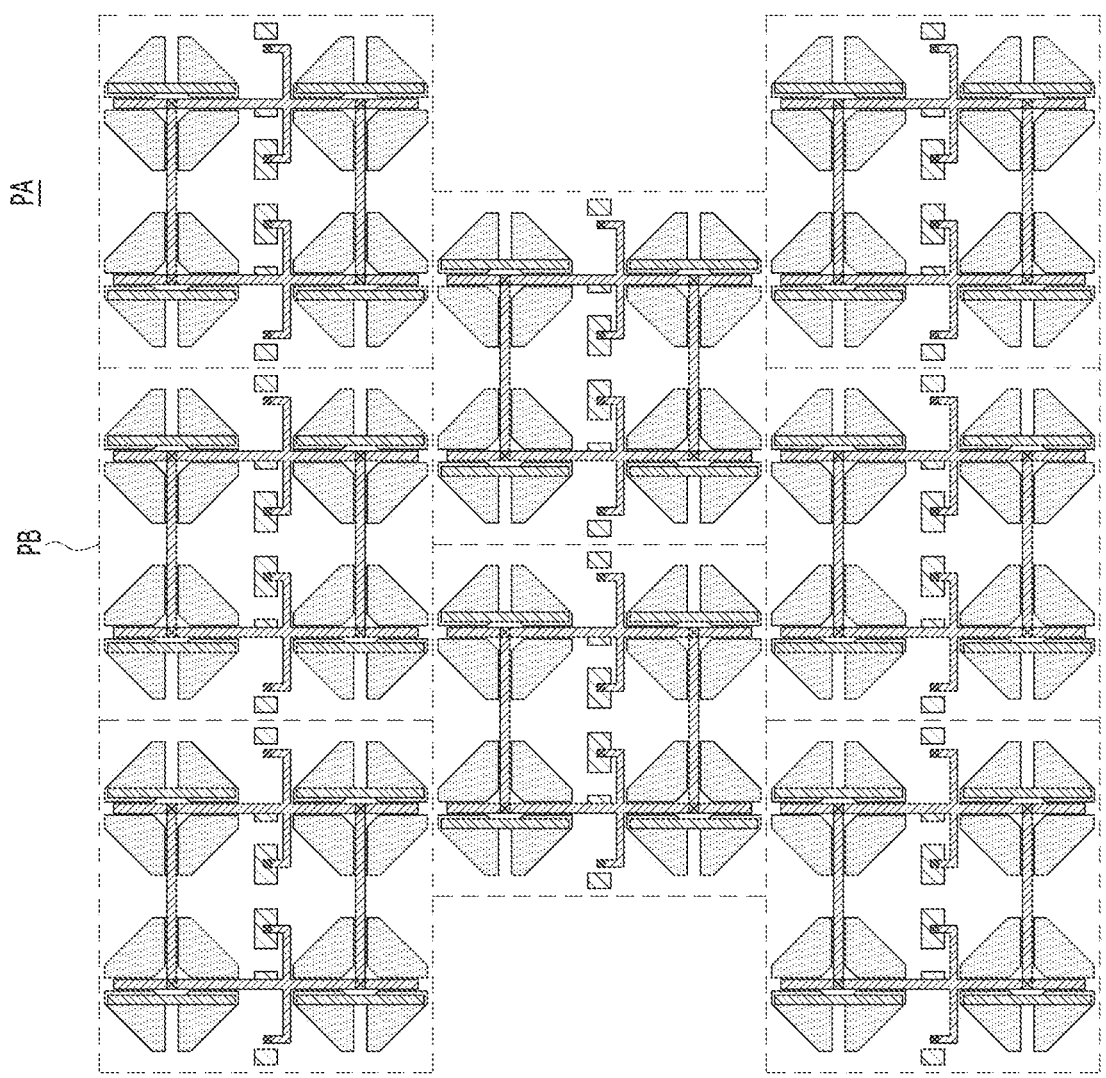
FIG. 6A is a layout diagram schematically illustrating an example of a pixel array of an image sensor based on an embodiment of the disclosed technology.
Figure 6B:
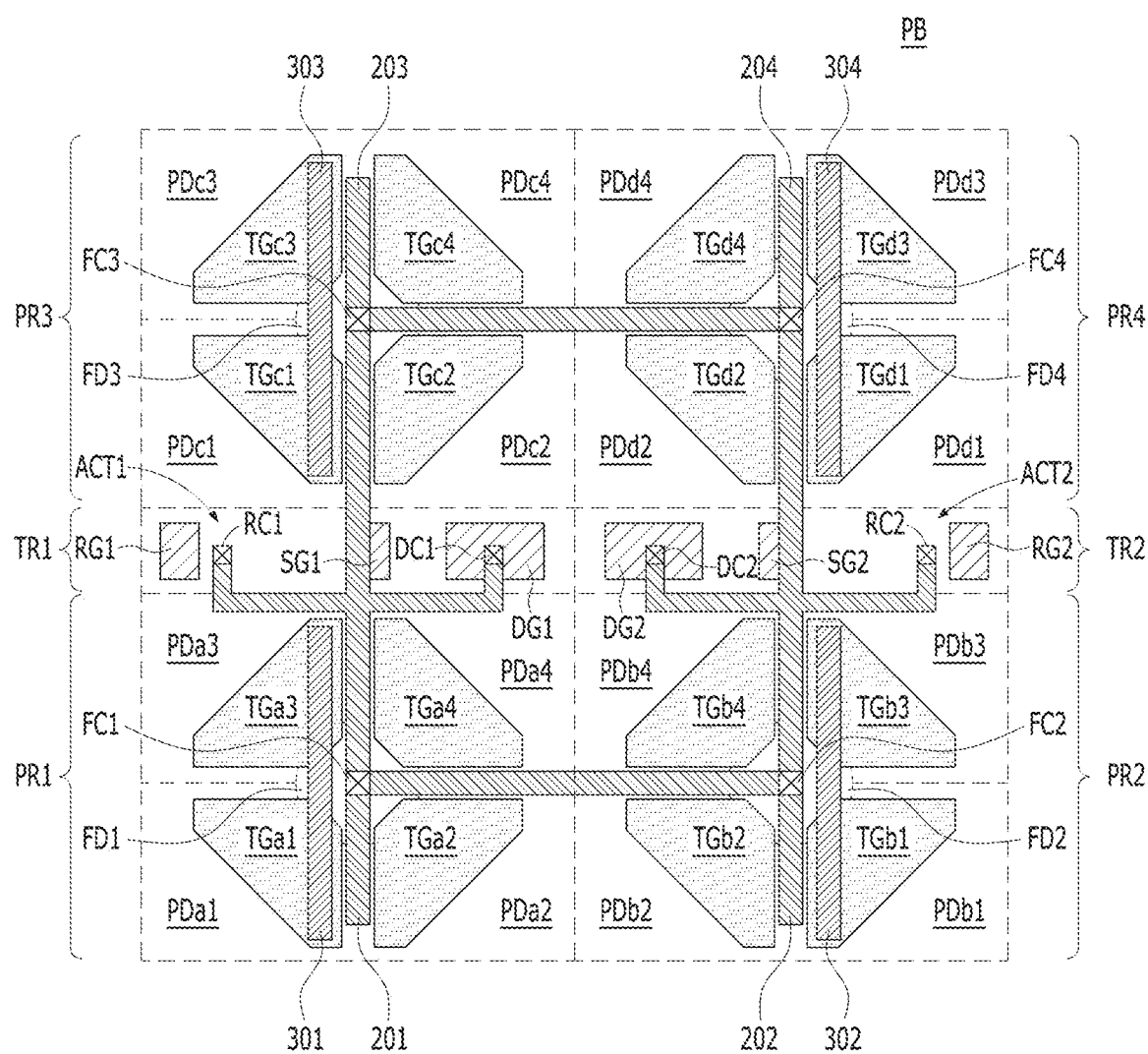
FIG. 6B is a layout diagram schematically illustrating one pixel block in the pixel array.
Figure 6C:
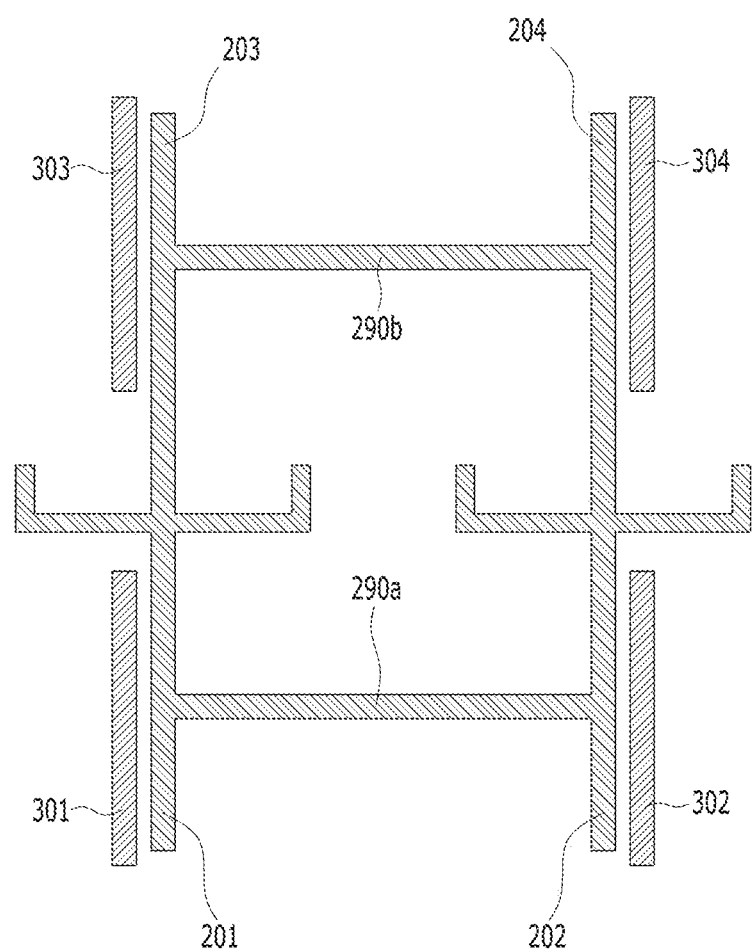
FIG. 6C is a layout diagram conceptually illustrating signal interconnects and shielding interconnects of the pixel block.

FIG. 6A is a layout diagram schematically illustrating an example of a pixel array PA of an image sensor based on an embodiment of the disclosed technology, FIG. 6B is a layout diagram schematically illustrating one pixel block PB in the pixel array PA, and FIG. 6C is a layout diagram conceptually illustrating signal interconnects 201 to 204 and shielding interconnects 301 to 304 of the pixel block PB.

Referring to FIGS. 6A to 6C, the pixel array PA may include a plurality of pixel blocks PB arranged in the form of a matrix. The plurality of pixel blocks PB may be aligned side by side in a row direction D1, and may be arranged in a zigzag style in a column direction D2.

Each pixel block PB may include first to fourth photoelectric conversion regions PR1 and PR4, first and second transistor regions TR1 and TR2, a signal interconnect 200, and a shielding interconnect 300. The first transistor region TR1 may be disposed between the first photoelectric conversion region PR1 and the third photoelectric conversion region PR3, and the second transistor region TR2 may be disposed between the second photoelectric conversion region PR2 and the fourth photoelectric conversion region PR4.

First photoelectric conversion elements PDa1 to PDa4 may be disposed in the first photoelectric conversion region PR1 in the form of a matrix, second photoelectric conversion elements PDb1 to PDb4 may be disposed in the second photoelectric conversion region PR2 in the form of a matrix, third photoelectric conversion elements PDc1 to PDc4 may be disposed in the third photoelectric conversion region PR3 in the form of a matrix, and fourth photoelectric conversion elements PDd1 to PDd4 may be disposed in the fourth photoelectric conversion region PR4 in the form of a matrix. First to fourth floating diffusions FD1 to FD4 may be disposed at the centers of the first to fourth photoelectric conversion elements PDa1 to PDa4, PDb1 to PDb4, PDc1 to PDc4 and PDd1 to PDd4, respectively. First transfer gates TGa1 to TGa4 may be disposed to partially overlap with the first photoelectric conversion elements PDa1 to PDa4 and the first floating diffusion FD1, respectively. Second transfer gates TGb1 to TGb4 may be disposed to partially overlap with the second photoelectric conversion elements PDb1 to PDb4 and the second floating diffusion FD2, respectively. Third transfer gates TGc1 to TGc4 may be disposed to partially overlap with the third photoelectric conversion elements PDc1 to PDc4 and the third floating diffusion FD3, respectively. Fourth transfer gates TGd1 to TGd4 may be disposed to partially overlap with the fourth photoelectric conversion elements PDd1 to PDd4 and the fourth floating diffusion FD4, respectively.

The first transistor region TR1 may include a first reset gate RG1, a first select gate SG1, and a first drive gate DG1, which are disposed on a first active region ACT1 in the row direction D1, and the second transistor region TR2 may include a second drive gate DG2, a second select gate SG2, and a second reset gate RG2, which are disposed on a second active region ACT2 in the row direction D1. The components RG1, SG1 and DG1 in the first transistor region TR1 and the components DG2, SG2 and RG2 in the second transistor region TR2 may be symmetrical to each corresponding component.

The pixel block PB may include first to fourth signal interconnects 201 to 204, first and second interconnecting signal interconnects 290a and 290b, and first to fourth shielding interconnects 301 to 304.

The first signal interconnect 201 may electrically connect the first floating diffusion FD1, a portion of the first active region ACT1, and the first drive gate DG1 to each other, and the second signal interconnect 202 may electrically connect the second floating diffusion FD2, a portion of the second active region ACT2, and the second drive gate DG2 to each other.

The third signal interconnect 203 may be connected to the first signal interconnect 201. The third signal interconnect 203 may electrically connect the third floating diffusion FD3, the portion of the first active region ACT1, and the first drive gate DG1 to each other. Therefore, the components in the first photoelectric conversion region PR1 and the components in the third photoelectric conversion region PR3 may share the components in the first transistor region TR1.

The fourth signal interconnect 204 may be connected to the second signal interconnect 202. The fourth signal interconnect 204 may electrically connect the fourth floating diffusion FD4, the portion of the second active region ACT2, and the second drive gate DG2 to each other. Therefore, the components in the second photoelectric conversion region PR2 and the components in the fourth photoelectric conversion region PR4 may share the components in the second transistor region TR2.

The first interconnecting signal interconnect 290a may connect the first signal interconnect 201, and the second signal interconnect 202 to each other, and the second interconnecting signal interconnect 290b may connect the third signal interconnect 203, and the fourth signal interconnect 204 to each other. Since the first to fourth signal interconnections 201 to 204 may be electrically connected to one another, the components in the first to fourth photoelectric conversion regions PR1 to PR4 may share the components in the first and second transistor regions TR1 and TR2.

Figure 7A:
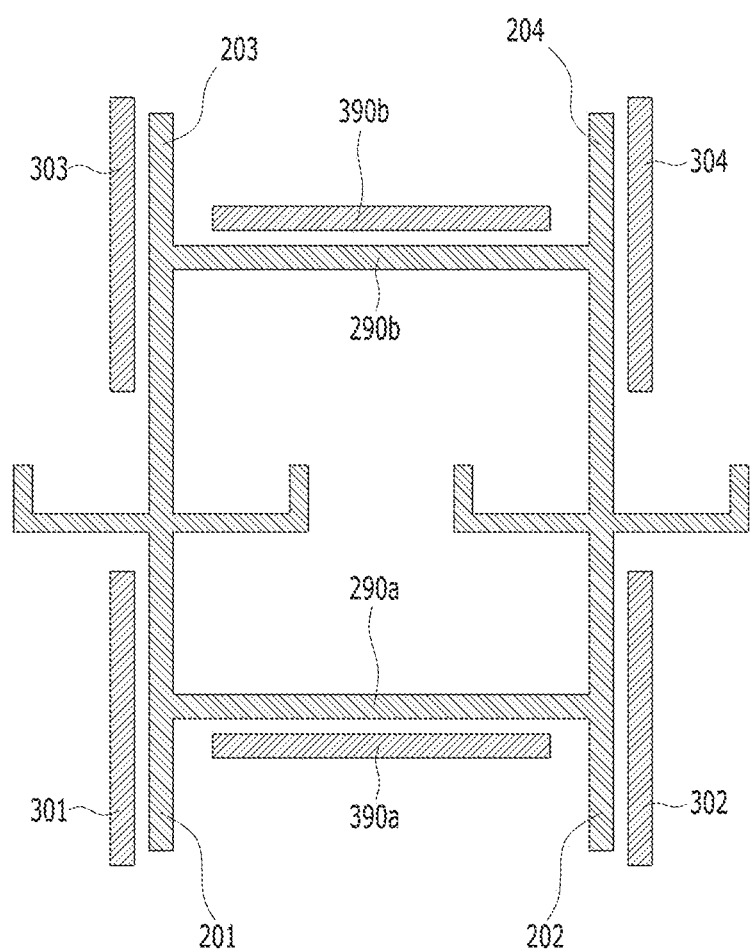
FIGS. 7A to 7C are layout diagrams illustrating examples of signal interconnects and shielding interconnects based on various embodiments of the disclosed technology.
Figure 7B:
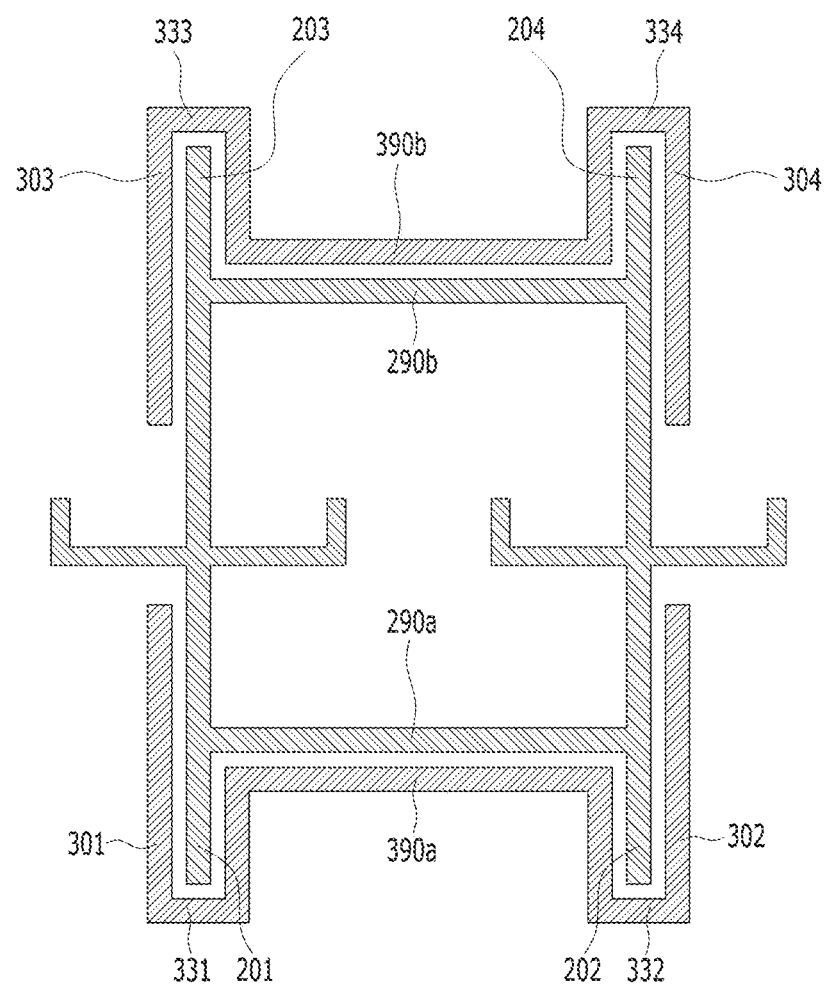
Figure 7C:
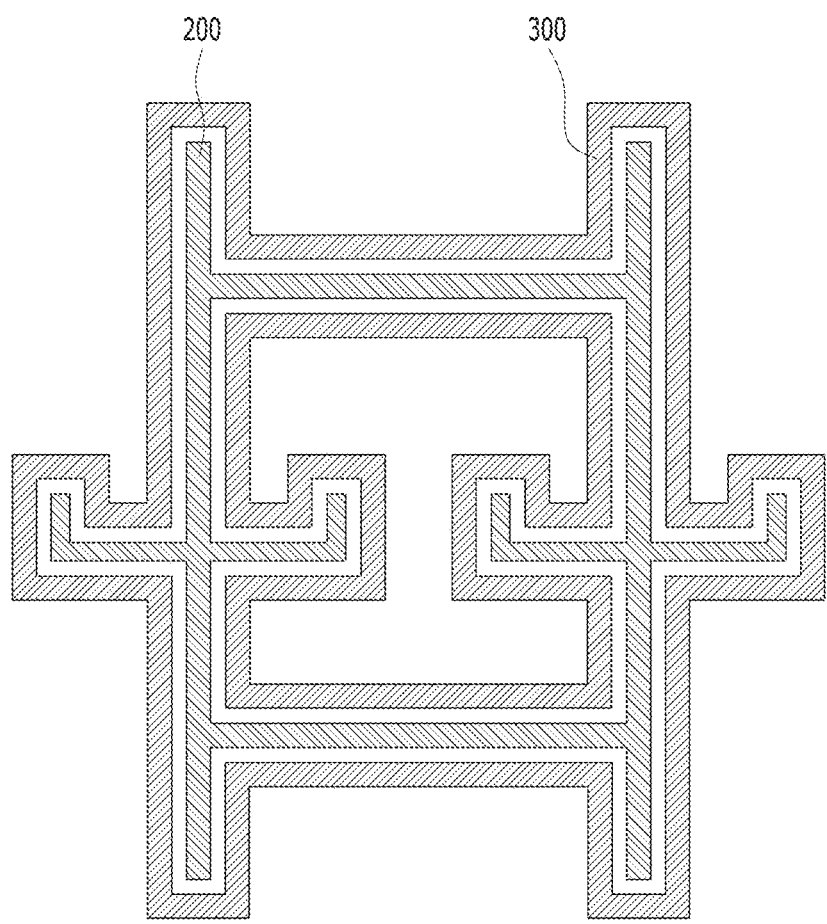

FIGS. 7A to 7C are layout diagrams illustrating examples of shielding interconnects 300 based on various embodiments of the disclosed technology. Referring to FIG. 7A, a shielding interconnect 300 based on an embodiment of the disclosed technology may include first to fourth shielding interconnects 301 to 304, and first and second interconnecting shielding interconnects 390a and 390b. The first to fourth shielding interconnects 301 to 304 may extend in the column direction D2 to be parallel to first to fourth signal interconnects 201 to 204. The first and second interconnecting shielding interconnects 390a and 390b may extend in the row direction D1 to be parallel to first and second interconnecting signal interconnects 290a and 290b. The first to fourth shielding interconnects 301 to 304 and the first and second interconnecting shielding interconnects 390a and 390b may be electrically connected with each other.

Referring to FIG. 7B, a shielding interconnect 300 based on an embodiment of the disclosed technology may include first to fourth shielding interconnects 301 to 304, first and second interconnecting shielding interconnects 390a and 390b, first and second lower interconnecting shielding interconnects 331 and 332, and first and second upper interconnecting shielding interconnects 333 and 334. The first lower interconnecting shielding interconnect 331 may connect the first shielding interconnect 301 to the first interconnecting shielding interconnect 390a while being separated from a first signal interconnect 201, the second lower interconnecting shielding interconnect 332 may connect the second shielding interconnect 302 and the first interconnecting shielding interconnect 390a while being separated from a second signal interconnect 202, the third upper interconnecting shielding interconnect 333 may connect the third shielding interconnect 303 and the second interconnecting shielding interconnect 390b while being separated from a third signal interconnect 203, and the fourth upper interconnecting shielding interconnect 334 may connect the fourth shielding interconnect 304 and the second interconnecting shielding interconnect 390b while being separated from a fourth signal interconnect 204.

Referring to FIG. 7C, a shielding interconnect 300 based on an embodiment of the disclosed technology may be disposed to two-dimensionally surround a signal interconnect 200, when viewed from the top. The shielding interconnect 300 may completely surround the signal interconnect 200 or may not surround at least a portion, when viewed from the top. That is to say, a portion of the shielding interconnect 300 may be open.

Figure 8:
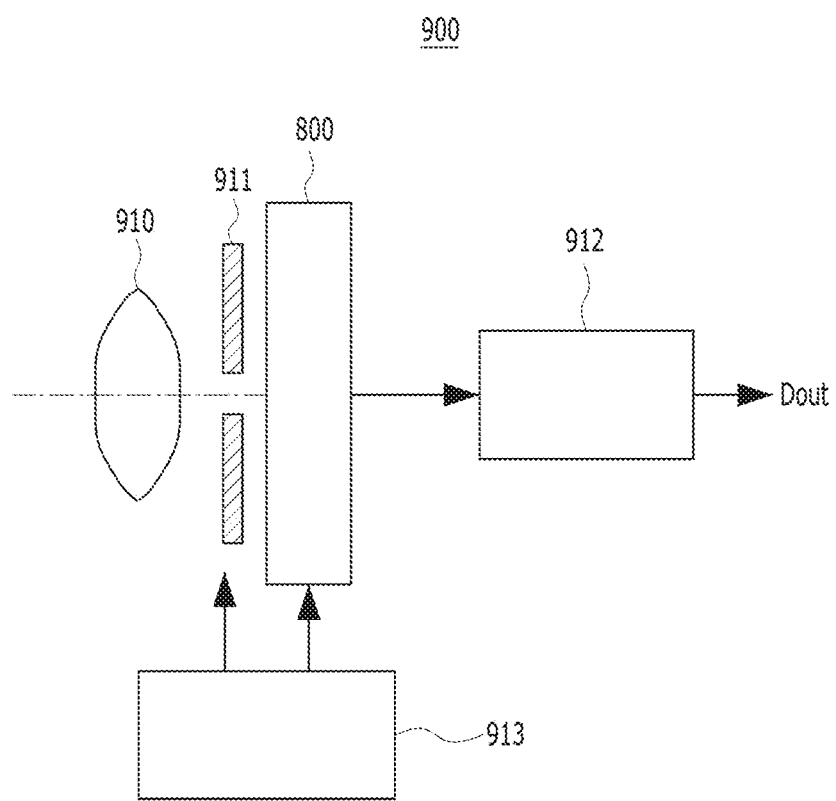
FIG. 8 is a diagram schematically illustrating an example of a camera system including an image sensor based on an embodiment of the disclosed technology.

FIG. 8 is a diagram schematically illustrating an example of a camera system 900 including an image sensor 800 based on an embodiment of the present disclosure. Referring to FIG. 8, the camera system 900 including at least one of various image sensors 800 based on the embodiments of the disclosed technology may photograph a still image or a moving image. The camera system 900 may include an optical lens system 910, a shutter unit 911, a signal processing circuit 912, and a driving circuit 913 which controls/drives the image sensor 800 and the shutter unit 911. The camera system 900 may guide image light (Li) (incident light) from an object, to a pixel array (see the reference numeral 810 of FIG. 1) of the image sensor 800. The optical lens system 910 may include a plurality of optical lenses. The shutter unit 911 may control a light radiation period and a light shielding period with respect to the image sensor 800. The signal processing circuit 912 may perform various kinds of signal processing for the signal outputted from the image sensor 800. An image signal Dout after signal processing may be stored in a storage medium such as a memory or may be outputted to a monitor or the like. The driving circuit 913 may control the transfer operation of the image sensor 800 and the shutter operation of the shutter unit 911.

Although various embodiments have been described for illustrative purposes, it will be apparent to those skilled in the art that various changes and modifications may be made without departing from the spirit and scope of the invention as defined in the following claims.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An image sensor including one or more first unit pixels, each of the one or more first unit pixels comprising:
    a first photoelectric conversion region including first photoelectric conversion elements arranged in the form of a matrix, and a first floating diffusion region at a center of the first photoelectric conversion elements;
    a first transistor region including a first active region in which a first reset gate, a first select gate and a first drive gate are disposed;
    a first signal interconnect electrically connecting the first floating diffusion region to the first drive gate; and a first shielding interconnect separated from the first signal interconnect and extending parallel to the first signal interconnect, wherein the first signal interconnect comprises:

a first upper signal interconnect extending between the first photoelectric conversion region and the first transistor region in a row direction of a matrix formed by the first photoelectric conversion elements, and electrically connected to a portion of the first active region and the first drive gate, wherein the first shielding interconnect comprises:

a first upper shielding interconnect parallel to the first upper signal interconnect, wherein each of the first upper signal interconnect and the first upper shielding interconnect has a bent shape that extends in the row direction and a column direction.

2. The image sensor according to claim 1, wherein the first signal interconnect further comprises:

a first lower signal interconnect extending between the first photoelectric conversion elements in the column direction of the matrix formed by the first photoelectric conversion elements, and electrically connected to the first floating diffusion region.

3. The image sensor according to claim 2, wherein the first shielding interconnect further comprises:

a first lower shielding interconnect parallel to the first lower signal interconnect.

4. The image sensor according to claim 3, wherein each of the first lower signal interconnect and the first lower shielding interconnect has a linear shape.

5. The image sensor according to claim 2, wherein the first lower signal interconnect is connected to the first floating diffusion region through a first floating diffusion region contact, wherein the first lower signal interconnect includes an upper portion which extends between the first upper signal interconnect and the first floating diffusion region contact, and a lower portion which extends between the first floating diffusion region contact and a lower end of the first lower signal interconnect, and wherein the lower end of the first lower signal interconnect is floated.

6. The image sensor according to claim 5, wherein the first shielding interconnect includes an upper portion arranged parallel to the upper portion of the first lower signal interconnect, and a lower portion arranged parallel to the lower portion of the first lower signal interconnect.

7. The image sensor according to claim 1, wherein each of the one or more first unit pixels further comprises:

a first additional shielding interconnect disposed along a side of the signal interconnect opposite to the first shielding interconnect, wherein the first additional shielding interconnect and the first shielding interconnect are symmetrical about the signal interconnect.

8. The image sensor according to claim 7, wherein the first signal interconnect comprises:

a first lower signal interconnect extending between the first photoelectric conversion elements in a column direction of matrix formed by the first photoelectric conversion elements, and electrically connected to the first floating diffusion region, wherein the first shielding interconnect comprises:

a first lower shielding interconnect parallel to the first lower signal interconnect, and wherein the additional first shielding interconnect comprises:

a first additional lower shielding interconnect symmetrical to the first lower shielding interconnect; and a first additional upper shielding interconnect symmetrical to the first upper shielding interconnect.

9. The image sensor according to claim 7, wherein each of the one or more first unit pixels further comprises:

a second additional shielding interconnect connecting the first shielding interconnect to the first additional shielding interconnect.

10. The image sensor according to claim 1, wherein the first shielding interconnect is disposed to overlap with at least two of the first photoelectric conversion elements.

11. An image sensor comprising:

one or more first unit pixels, one or more second unit pixels, and an additional signal interconnect, wherein each of the one or more first unit pixels comprises:

a first photoelectric conversion region including first photoelectric conversion elements arranged in the form of a matrix, and a first floating diffusion region at a center of the first photoelectric conversion elements;

a first transistor region including a first active region in which a first reset gate, a first select gate and a first drive gate are disposed;

a first signal interconnect electrically connecting the first floating diffusion region to the first drive gate; and a first shielding interconnect separated from the first signal interconnect and extending parallel to the first signal interconnect, wherein each of the one or more second unit pixels comprises:

a second photoelectric conversion region including second photoelectric conversion elements arranged in the form of a matrix, and a second floating diffusion region at a center of the second photoelectric conversion elements;

a second transistor region including a second active region in which a second reset gate, a second select gate and a second drive gate are disposed;

a second signal interconnect electrically connecting the second floating diffusion to the second drive gate; and a second shielding interconnect disposed to be parallel to the second signal interconnect and overlap with at least one of the second photoelectric conversion elements, wherein the first unit pixel and the second unit pixel are symmetrical to each other, and wherein the additional signal interconnect electrically connects the first signal interconnect to the second signal interconnect.

12. The image sensor according to claim 11, further comprising:

an additional shielding interconnect parallel to the additional signal interconnect.

13. The image sensor according to claim 12, wherein the additional signal interconnect and the additional shielding interconnect extend in in a row direction of matrix formed by the second photoelectric conversion elements.

14. The image sensor according to claim 11, wherein the first shielding interconnect is positioned on a first side of the first signal interconnect, wherein the second shielding interconnect is positioned on a second side of the second signal interconnect, and wherein the first side and the second side are opposite to each other.

15. An image sensor comprising:

a pixel block having a first unit pixel a second unit pixel and an additional signal interconnect, the first unit pixel comprising:
- a first photoelectric conversion region in which a first floating diffusion region is disposed;
- a first transistor region in which a first drive gate is disposed;
- a first signal interconnect electrically connecting the first floating diffusion region to the first drive gate; and
- a first shielding interconnect disposed in a first side direction of the first signal interconnect, the first shielding interconnect being parallel to the first signal interconnect, the second unit pixel comprising:
- a second photoelectric conversion region in which a second floating diffusion region is disposed;
- a second transistor region in which a second drive gate is disposed;
- a second signal interconnect electrically connecting the second floating diffusion region to the second drive gate; and
- a second shielding interconnect disposed in a second side direction of the second signal interconnect, the second shielding interconnect being parallel to the second signal interconnect, wherein the first side direction and the second side direction are opposite to each other, and wherein the additional signal interconnect electrically connects the first signal interconnect to the second signal interconnect.

16. The image sensor according to claim 15, wherein a layout of the first unit pixel and a layout of the second unit pixel are symmetrical to each other.

17. The image sensor according to claim 15,
wherein the first photoelectric conversion region includes four first photoelectric conversion elements disposed in the form of a matrix,
wherein the second photoelectric conversion region includes four second photoelectric conversion elements disposed in the form of a matrix,
wherein the first shielding interconnect overlaps with at least two of the four first photoelectric conversion elements, and
wherein the second shielding interconnect overlaps with at least two of the four second photoelectric conversion elements.

18. The image sensor according to claim 15,
wherein the first signal interconnect comprises:
a first upper signal interconnect electrically connecting the first drive gate to a portion of a first active region in the first transistor region; and
a first lower signal interconnect electrically connecting a middle portion of the first upper signal interconnect to the first floating diffusion region, and
wherein the second signal interconnect comprises:
a second upper signal interconnect electrically connecting the second drive gate to a portion of a second active region in the second transistor region; and
a second lower signal interconnect electrically connecting a middle portion of the second upper signal interconnect to the second floating diffusion region.

19. The image sensor according to claim 15,
wherein the first lower signal interconnect further includes a first extended portion which extends from the first floating diffusion region to a lower end of the first lower signal interconnect,
wherein the second lower signal interconnect further includes a second extended portion which extends from the second floating diffusion region to a lower end of the second lower signal interconnect,
wherein the first shielding interconnect extends to be parallel to the first extended portion,
wherein the second shielding interconnect extends to be parallel to the second extended portion, and
wherein the first extended portion and the second extended portion are in a high-impedance state.

* * * * *